(12) United States Patent
Kinezuka et al.

(10) Patent No.: US 6,428,341 B2
(45) Date of Patent: Aug. 6, 2002

(54) INSPECTING JIG FOR WIRE HARNESS

(75) Inventors: Kenji Kinezuka; Junya Yoneyama, both of Shizuoka (JP)

(73) Assignee: Yazaki Corporation, Tokyo (JP)

(*) Notice: Subject to any disclaimer, the term of this patent is extended or adjusted under 35 U.S.C. 154(b) by 0 days.

(21) Appl. No.: 09/788,551

(22) Filed: Feb. 21, 2001

(30) Foreign Application Priority Data

Mar. 10, 2000 (JP) ........................................ 2000-066289

(51) Int. Cl.[7] ............................................. H01R 13/627
(52) U.S. Cl. ........................ 439/358; 439/310; 439/488; 324/538
(58) Field of Search ............................... 174/72 A, 68.1; 439/310, 357, 358, 372, 488; 324/538

(56) References Cited

U.S. PATENT DOCUMENTS

| | | | | |
|---|---|---|---|---|
| 4,452,501 A | * | 6/1984 | Gladd et al. ............... | 339/91 R |
| 5,467,023 A | * | 11/1995 | Takeyama .................... | 324/754 |
| 5,561,372 A | * | 10/1996 | Watanabe et al. ........ | 324/158.1 |
| 5,689,191 A | * | 11/1997 | Kashiyama ................. | 324/538 |
| 5,703,279 A | * | 12/1997 | Igura et al. ..................... | 73/40 |
| 5,721,387 A | * | 2/1998 | Watanabe et al ........... | 73/865.9 |
| 5,820,400 A | * | 10/1998 | Yamanashi et al. ......... | 439/358 |
| 5,859,534 A | * | 1/1999 | Saijo et al. .................. | 324/538 |
| 6,247,966 B1 | * | 6/2001 | Klein et al. ................. | 439/595 |
| 6,280,236 B1 | * | 8/2001 | Daoud ........................ | 439/482 |

FOREIGN PATENT DOCUMENTS

JP    6-267630    9/1994

* cited by examiner

Primary Examiner—Dean A. Reichard
Assistant Examiner—Adolfo Nino
(74) Attorney, Agent, or Firm—Armstrong, Westerman & Hattori, LLP

(57) ABSTRACT

An inspecting jig 1 for a wire harness for inspecting electric continuity of terminals 5 in a connector 8, comprising a jig body 10 having an opening 24 into which the connector is adapted to be inserted, a continuity checking part 11 adapted to be electrically connected to the terminals of the connector when the connector has entered into the opening, a lever member 12 swingably fitted to the jig body and including a locking portion 32 at its one end 12b which is adapted to be locked with an end face 8a of the connector 8 when the connector has entered into the opening 24, thereby to keep the terminals 5 and the continuity checking part 11 in an electrically connected state, and biasing means 13 for biasing the lever member 12 in a direction in which the locking portion 32 is locked with the end face 8a.

5 Claims, 5 Drawing Sheets

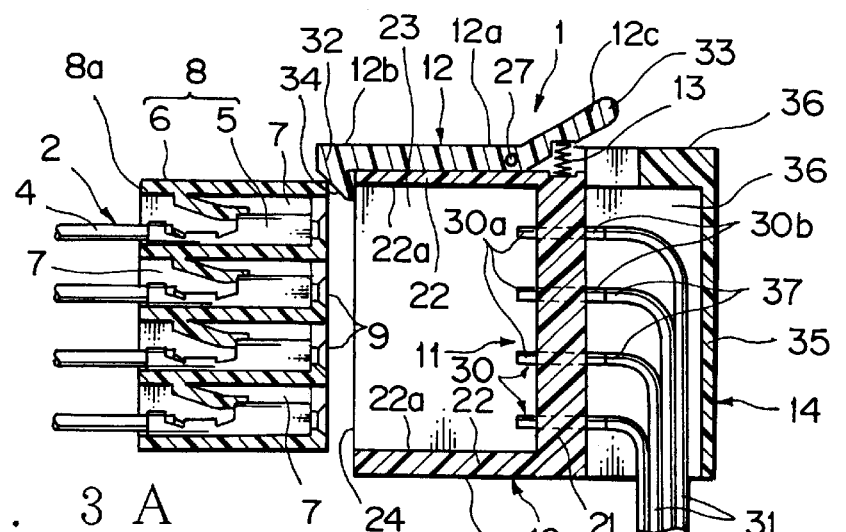
F I G. 3 A
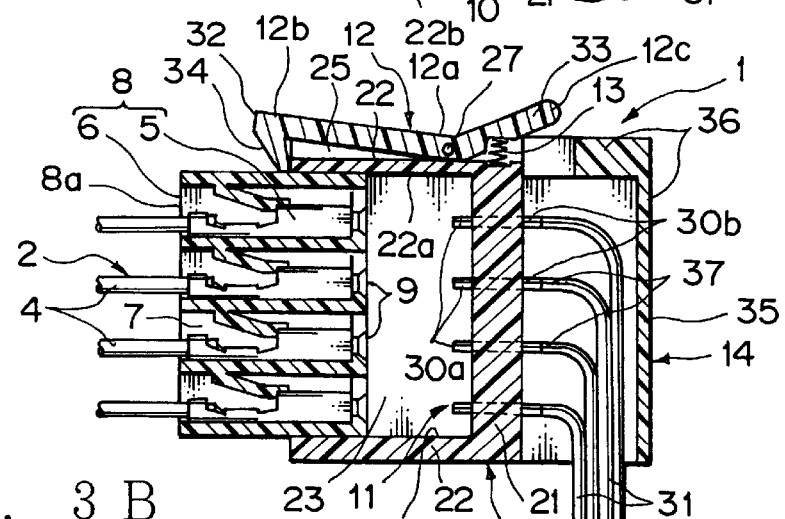
F I G. 3 B
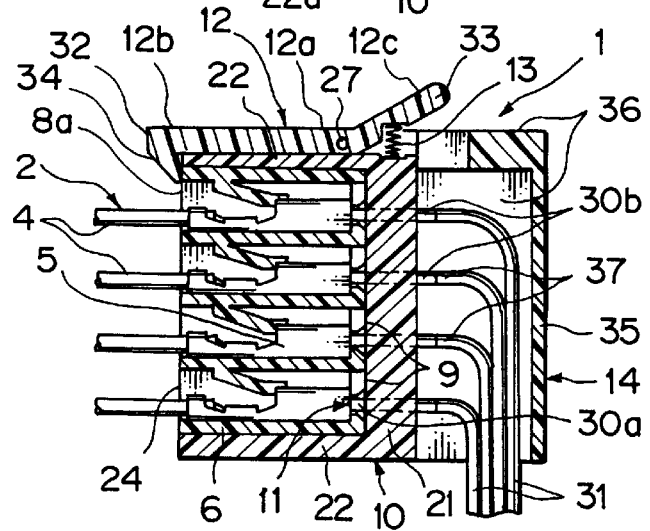
F I G. 3 C

INSPECTING JIG FOR WIRE HARNESS

BACKGROUND OF THE INVENTION

1. Field of the Invention

The present invention relates to an inspecting jig for a wire harness adapted to hold a connector of the wire harness ensuring electrical continuity of the wire harness with terminals, when the wire harness is subjected to continuity inspection.

2. Description of the Related Art

Conventionally, the wire harness provided with a plurality of electric wires and a connector containing terminals which are respectively connected to ends of the electric wires has been checked as to whether or not electrical continuity exists between each of the aforesaid terminals and another terminal. Thus, quality of the wire harness has been determined.

Heretofore, check of the wire harness of this type has been conducted in the following steps. One of the terminals of the wire harness is selected, and electricity is supplied to the selected terminal to determine whether potentials of the other terminals are high or low. The electricity is supplied to all the terminals in order, and in all the cases, the potentials of all other terminals except the supplied terminal are determined in order. Thus, mutual electrical continuity among all the terminals can be grasped.

By comparing the mutual electrical continuity among the terminals thus grasped as described above with the electrical continuity among the terminals in case that the wire harness is normal, whether the wire harness is normal or abnormal, and an abnormal portion if any has been detected.

In order to check the wire harness in the described manner, an inspecting jig 41 as shown in FIG. 6, for example, has been employed. The inspecting jig 41 as illustrated in FIG. 6 holds the connector and ensures electrical continuity with respective terminals in the connector.

The inspecting jig 41 includes a base plate 42 mounted on a substantially flat table or the like, an operating lever 43, a continuity checking part 44, and a connector receiving part 45. The base plate 42 is provided with a pair of side walls 46 which are arranged in parallel to each other.

The operating lever 43 is rotatably supported on respective one ends of the side walls 46. The connector receiving part 45 which is provided at the other ends of the side walls 46 holds the connector in a state where an opening of a terminal inserting chamber is opposed to the operating lever 43. In the illustrated embodiment, the connector can be freely engaged in and detached from the connector receiving part 45 in a vertical direction.

The continuity checking part 44 is provided in a middle part of the side walls 46 and supported by the side walls 46 so as to move close to and apart from the connector receiving part 45. The continuity checking part 44 has a plurality of contact elements 47 which are adapted to get in touch with the terminals in the connector respectively.

The inspecting jig 41 is further provided with a link mechanism which is not shown in the drawing. The link mechanism interconnects the operating lever 43 and the continuity checking part 44. When the operating lever 43 is operated to rotate, the continuity checking part 44 slides to be brought in contact with or to be detached from the connector receiving part 45.

The connector is placed on the connector receiving part 45 in the inspecting jig 41, and then, the operating lever 43 is operated to bring the continuity checking part 44 in a vicinity of the connector so as to ensure electrical continuity between the terminals of the connector and the aforesaid contact elements 47. Then, by supplying electricity to the terminals in order by way of the contact elements, the electrical continuity between the terminals can be confirmed.

However, in the described inspecting jig 41, the continuity checking part 44 is slidably supported by the side walls 46 and so on so as to move close to and apart from the connector receiving part 45. Therefore, in order to allow the continuity checking part 44 to slide, the inspecting jig 41 tends to be increased in size. Because of the increased size of the inspecting jig, an area required for installing the inspecting jig in a production line of the wire harness has been also increased.

Moreover, because there have been provided the link mechanism and so on for enabling the continuity checking part 44 to slide by rotating the operating lever 43, the structure of the jig 41 has become relatively complicated, and components of the jig 41 itself tend to be increased in number. Further, maintenance performance for the jig 41 itself is likely to be deteriorated because of the complexity of the mechanism, and the cost for the jig 41 itself tends to rise because of the increase in number of the components.

In view of the above, an object of the present invention is to provide an inspecting jig for a wire harness which can be made compact and in which number of components can be restrained thereby avoiding deterioration of maintenance performance and a rise of cost.

SUMMARY OF THE INVENTION

In order to attain the above described object, there is provided, according to the present invention, an inspecting jig for a wire harness for inspecting electric continuity of terminals in a connector, comprising a jig body having an opening into which the connector is adapted to be inserted, a continuity checking part adapted to be electrically connected to terminals of the connector when the connector has entered into the opening, a lever member swingably fitted to the jig body and including a locking portion which is adapted to be locked with an end face of the connector when the connector has entered into the opening, thereby to keep the terminals and the continuity checking part in an electrically connected state, after the locking portion has been locked with the end face, and biasing means for biasing the lever member in a direction in which the locking portion is locked with the end face of the connector.

According to a second aspect of the invention, the lever member is provided with an operating portion for disengaging the lock between the locking portion and the end face, the operating portion projecting outward from an outer face of the jig body.

According to a third aspect of the invention, the locking portion projects outward from the opening in a direction of inserting the connector, and includes a slanted face which is opposed to the connector when the connector is being inserted into the opening and gradually slanted toward an interior of the opening with respect to the inserting direction.

According the first aspect of the invention, the lever member is swingably provided in the jig body, and the locking portion of this lever member is locked with the end face of the connector, whereby electrical continuity with the terminals can be ensured. There will be no need of the continuity checking part or so which is adapted to slide in order to maintain the electrical continuity with the terminals.

Moreover, due to a fact that the lever member having the locking portion to be locked with the end face of the connector is swingably provided in the jig body, a mechanism necessary for electrically connecting the continuity checking part to the terminals will be simplified. In addition, since the locking portion is locked with the end face of the connector, there will be no need of connector holding means such as a recess in the connector.

According the second aspect of the invention, since the operating portion is projected outward from the outer face of the jig body, the locking portion can be easily disengaged from the lock with the end face of the connector, by operating the operating portion against biasing force of the biasing means.

According the third aspect of the invention, because the slanted face is opposed to the connector, the slanted face and the connector are abutted against each other when the connector is inserted into the opening. Because of the slanted contour of the slanted face toward the interior of the opening, as the connector is further inserted into the opening, the lever member is guided by the slanted face to swing in a direction in which the locking portion is disengaged from the end face of the connector. Then, after the connector has been completely received in the opening, the locking portion is locked with the end face of the connector by means of the biasing force of the biasing means.

BRIEF DESCRIPTION OF THE DRAWINGS

FIGS. 3A, 3B and 3C are sectional views showing steps in which a connector is mounted in the inspecting jig for the wire harness according to the embodiment;

DESCRIPTION OF THE PREFERRED EMBODIMENTS

Figure 1:
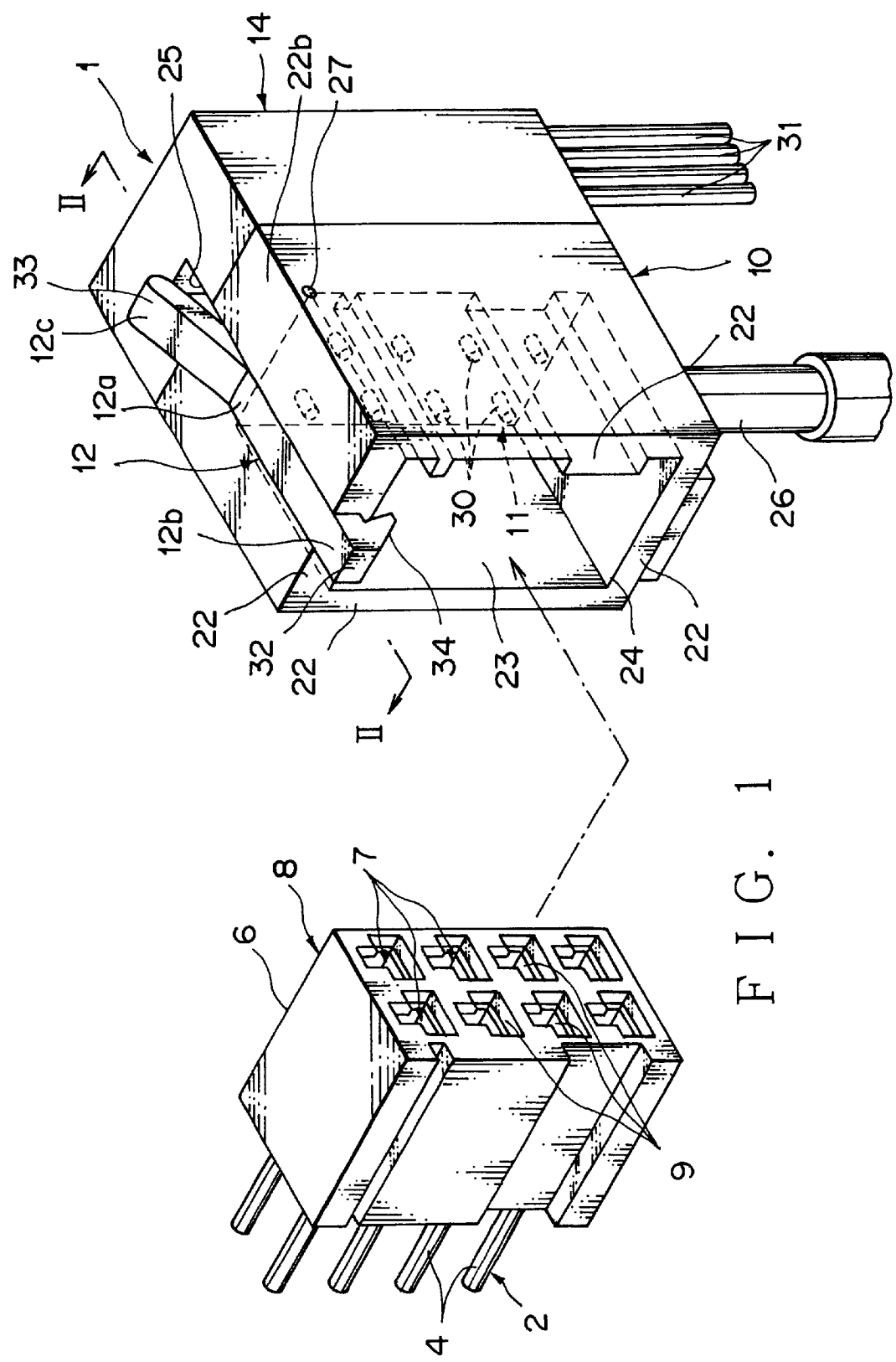
FIG. 1 is a perspective view of an inspecting jig for a wire harness according to one embodiment of the present invention.
Figure 2:
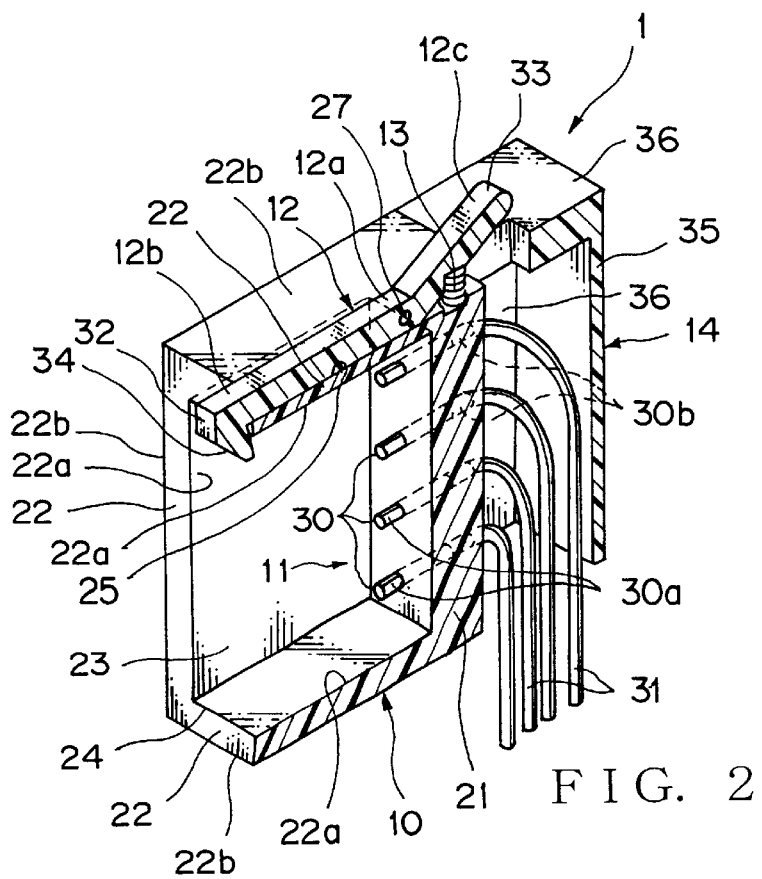
FIG. 2 is a sectional view taken along a line II—II of FIG. 1.
Figure 6:
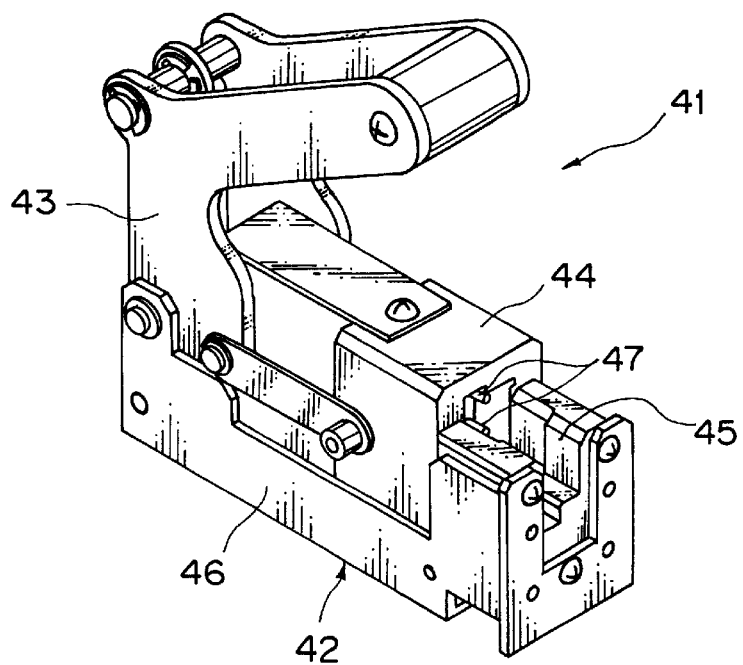
FIG. 6 is a perspective view of a conventional inspecting jig.

Now, an inspecting jig 1 for a wire harness according to one embodiment of the present invention will be described referring to FIGS. 1 to 5. The inspecting jig 1 for the wire harness as shown in FIG. 1 is used for checking electrical continuity of a wire harness 2.

As shown in FIGS. 1, and 3 to 5, the wire harness 2 includes a plurality of electric wires 4, terminals 5 attached to respective ends of the electric wires 4, and a connector housing 6 containing the terminals 5. The electric wire 4 is a so-called covered wire consisting of a core wire made of conductive metal, and a covering made of insulating synthetic resin or the like to cover the core wire.

The terminal 5 is formed by folding a metal plate which is made of conductive metal or the like. The terminal 5 is electrically connected to the core wire of the electric wire 4. The connector housing 6 is made of insulating synthetic resin or the like and formed in a box-like shape having a plurality of terminal containing chambers 7 in which the terminals 5 are contained. It is possible to visually observe the terminals 5 from outside through openings 9 which are formed in an outer wall face of the connector housing 6. The terminals 5 and the connector housing 6 containing the terminals 5 constitute a connector 8.

A wire harness inspecting jig 1 is so designed to hold the connector 8 to keep electrical continuity with the respective terminals 5. The wire harness inspecting jig 1 consists of a jig body 10, a continuity checking part 11, an operating lever 12, as a lever member, a coil spring 13 as biasing means, and a cover 14.

The jig body 10 is made of insulating synthetic resin or the like, and formed in a box-like shape having a flat rear wall 21 and a plurality of surrounding walls 22. The rear wall 21 has a flat face in a rectangular shape, and the surrounding walls 22 are connected to respective edges of the rear wall 21. The surrounding walls 22 extend in a direction intersecting the rear wall 21, at a right angle in the illustrated embodiment.

A connector receiving chamber 23 is formed by a space defined by inner faces 22a of the surrounding walls 22 and a surface of the rear wall 21. Edges of the surrounding walls 22 remote from the rear wall 21 define an opening 24. A connector 8 is inserted into the connector receiving chamber 23 through the opening 24 of the jig body 10. Outer faces 22b of the surrounding walls 22 constitute outer faces of the jig body 10 described in the claims.

One of the surrounding walls 22 positioned in an upper part of the drawings is provided with a groove 25. The groove 25 is concaved from the outer face 22b of the aforesaid one surrounding wall 22. The groove 25 extends in a direction of inserting the connector 8 into the connector receiving chamber 23 between an edge of the one surrounding wall 22 near the rear wall 21 and the other edge thereof near the opening 24.

A support shaft 26 is fitted to the jig body 10. The support shaft 26 is adapted to be fixed to a table of a wire harness inspecting device or the like to support the jig body 10 on the table.

The continuity checking part 11 includes a plurality of electrically conductive pins 30 respectively formed of conductive metal or the like. Each of the electrically conductive pins 30 is passed through the rear wall 21 with its one end 30a positioned inside the connector receiving chamber 23 and with an opposite end 30b positioned in the back of the rear wall 21.

The one ends 30a of the conductive pins 30 are respectively provided at positions corresponding to the terminal containing chambers 7 in the connector 8 which is received in the connector receiving chamber 23. The conductive pins 30 are brought into contact with the terminals 5 in the connector 8 when the connector has been received in the connector receiving chamber 23 and electrically continued thereto. To the other ends 30b of the conductive pins 30, are attached electric wires 31 respectively. These electric wires 31 are connected to a control unit or the like of the aforesaid wire harness inspecting device which is not shown.

The operating lever 12 is made of insulating synthetic resin, for example, and formed in a pillar shape. The operating lever 12 is contained in the groove 25 extending in a direction of inserting the connector 8 into the connector receiving chamber 23.

A middle part 12a of the operating lever 12 is pivotally supported on the jig body 10 by means of a driving shaft 27. The driving shaft 27 extends in a direction intersecting the groove 25. In the illustrated embodiment, the driving shaft 27 intersects the groove 25 substantially at a right angle. Accordingly, the operating lever 12 is swingable around the driving shaft 27 like a seesaw. In other words, the operating lever 12 is attached to the jig body 10 so as to be swingable around its middle part 12a.

The operating lever 12 includes a locking portion 32 and an operating portion 33. The locking portion 32 is provided on one end 12b of the operating lever 12 adjacent to the opening 24, and projects outward from an edge of the surrounding wall 22 defining the opening 24 in a direction of insertion of the connector 8.

The locking portion 32 is formed in a hook-like shape. In a state where the operating lever 12 is biased by the coil spring 13 or the like, a tip end of the locking portion 32 projects from the inner face 22a of the surrounding wall 22 toward inside of the opening 24. When biased by the coil spring 13, the locking portion 32 is locked with a rear end face 8a in the back of the openings 9 of the connector 8 which has been received in the connector receiving chamber 23.

The locking portion 32 is further provided with a slanted face 34 which is opposed to the connector 8 when the connector 8 is being inserted into the connector receiving chamber 23. The slanted face 34 is brought into contact with an edge of the connector housing 6, when the connector 8 is inserted into the connector receiving chamber 23.

The slanted face 34 is slanted toward inside of the connector receiving chamber 23 with respect to the inserting direction of the connector 8, as it approaches the opening 24.

The operating portion 33 is provided at the other end 12c of the operating lever 12 remote from the opening 24. The operating portion 33 is bent from the aforesaid middle part 12a in an L-shape as seen from the side. The operating portion 33 projects from the outer face 22b of the surrounding wall 22 outward of the jig body 10.

The coil spring 13 is provided between a bottom of the groove 25 and the other end 12c of the operating lever 12, as shown in FIGS. 3 and 4. The coil spring 13 forces the other end 12c of the operating lever 12 away from the bottom of the groove 25.

Accordingly, the locking portion 32 of the operating lever 12 is biased by the coil spring 13 so as to project from the inner face 22a of the surrounding wall 22 toward the inside of the opening 24 and to be locked with the rear end face 8a of the connector 8.

The cover 14 consists of a flat wall 35, and three surrounding walls 36 continuing from the flat wall 35. The flat wall 35 is in a rectangular shape substantially equal to the shape of the rear wall 21.

The cover 14 is fitted to the jig body 10 by fixing edges of the surrounding walls 36 to the edges of the rear wall 21. One of the surrounding walls 36 is fitted to the surrounding wall 22 provided with the groove 25, while the other two walls 36 are connected to the other surrounding walls 22.

The cover 14 covers joint areas 37 between the conductive pins 30 and the electric wires 31, and serves to protect the joint areas 37 from any stress through the electric wires 31. In this manner, the joint areas 37 are protected by the cover 14 so that electrical continuity between the conductive pins 30 and the electric wires 31 may not be interrupted.

In order to insert the connector 8 of the wire harness 2 into the inspecting jig 1 of the structure as described above, the connector 8 and the inspecting jig 1 are arranged in such a manner that the openings 9 of the terminal containing chambers 7 are opposed to the opening 24. When the connector 8 is guided close to the opening 24, the edge of the connector housing 6 is abutted against the slanted face 34 as shown in FIG. 3A.

As the connector 8 is introduced into the connector receiving chamber 23, the operating lever 12 is displaced in such a direction that the one end 12b moves away from the bottom of the recess 25 as shown in FIG. 3B, due to the slanted contour of the slanted face 34. The operating lever 12 is pressed by the connector housing 6 and swings against biasing force of the coil spring 13.

Then, the tip end of the locking portion 32 rides on an outer face of the connector 8 to guide the connector 8 into the connector receiving chamber 23. When the connector 8 has been completely received in the connector receiving chamber 23, the operating lever 12 is displaced in such a direction that the one end 12b approaches to the bottom of the recess 25 as shown in FIG. 3C.

Then, the locking portion 32 is locked with the end face 8a, and the connector 8 is retained in the inspecting jig 1 for the wire harness keeping the electrical continuity between the conductive pins 30 and the terminals 5.

Figure 4A:
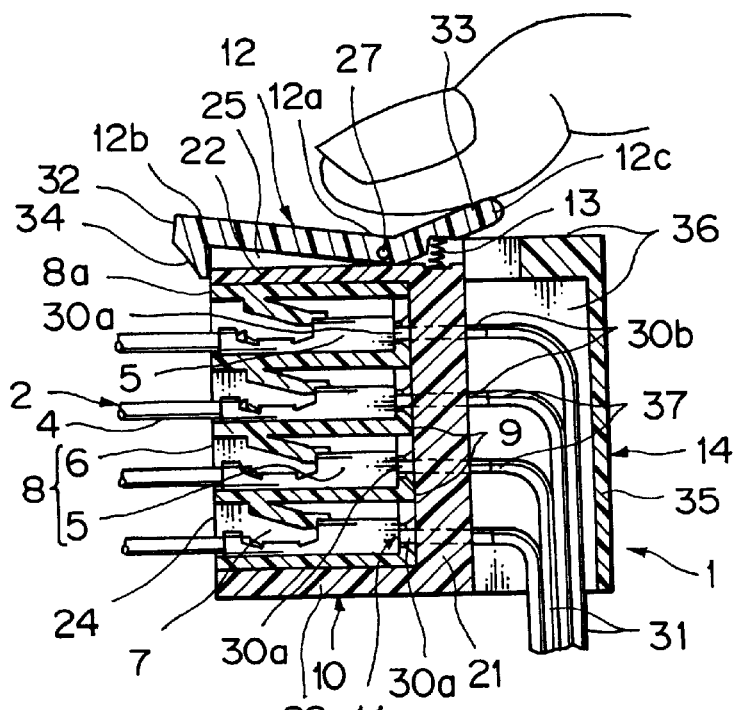
FIGS. 4A and 4B are sectional views showing steps in which the connector is detached from the inspecting jig for the wire harness according to the embodiment.
Figure 4B:
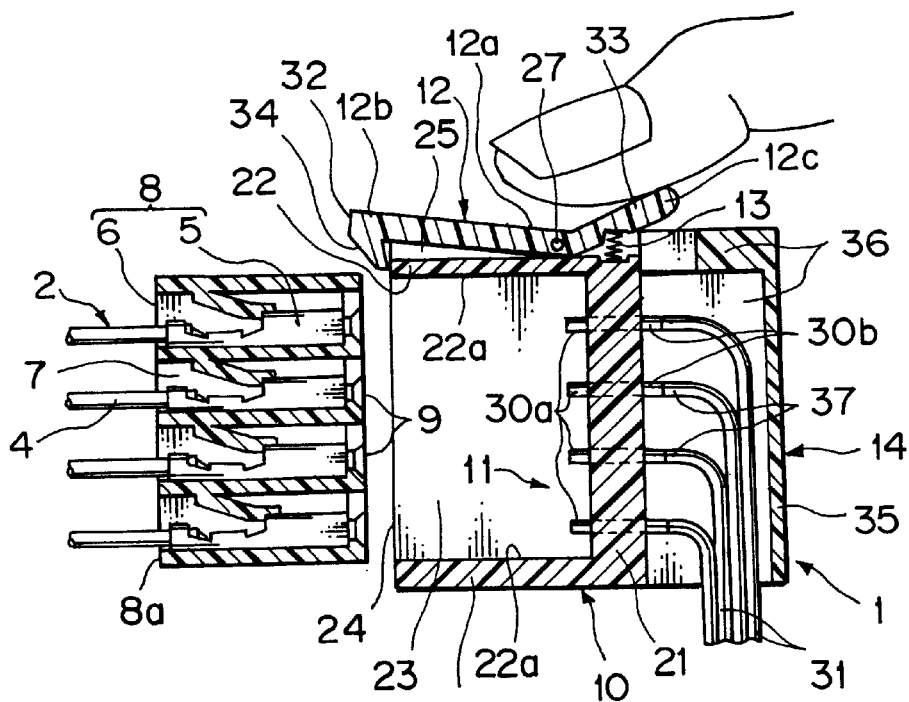
Figure 5:
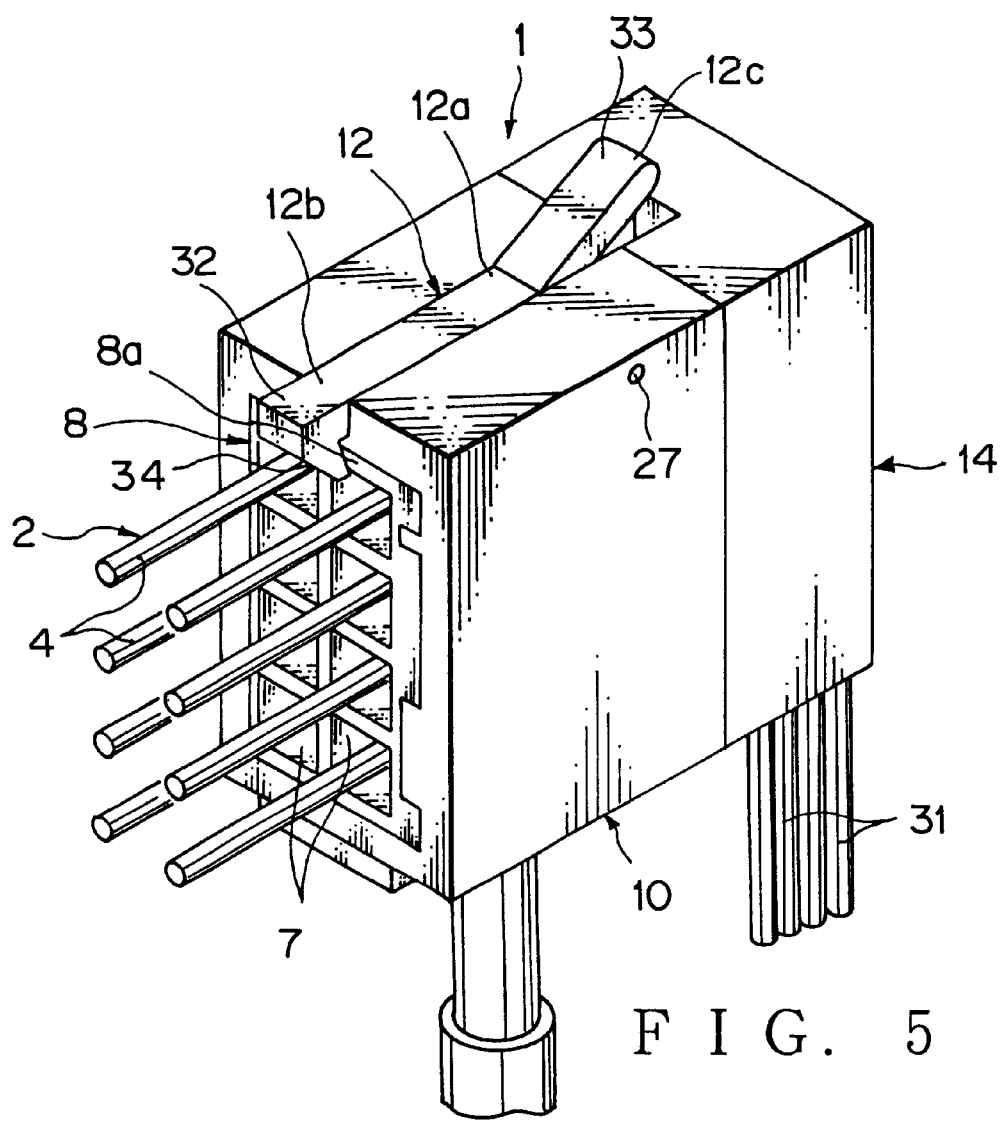
FIG. 5 is a perspective view of the inspecting jig for the wire harness according to the embodiment in a state where the connector is held therein.

In order to detach the connector 8 from the inspecting jig 1 for the wire harness after the continuity check of the wire harness 2 has been finished, the operating portion 33 is pressed so as to approach to the surrounding wall 22 as shown in FIG. 4A. Then, the lock of the locking portion 32 with the end face 8a is released. The connector 8 is withdrawn from the connector receiving chamber 23 while the operating portion 33 is kept pressed as shown in FIG. 4B.

According to the present embodiment, the operating lever 12 is swingably fitted to the jig body 10, so as to hold the connector 8 by locking the locking portion 32 of the operating lever 12 with the end face 8a. In this manner, the connector 8 can be reliably held with an extremely simple structure comprising the swingable operating lever 12 and soon. Therefore, the number of the components can be decreased, and deterioration of the maintenance performance and increase of the cost can be restrained.

Moreover, the continuity checking part 11 or the like need not slide to ensure the electrical continuity with the terminals 5. Accordingly, an area in which the continuity checking part 11 or the like slides will become unnecessary, and thus the inspecting jig can be made compact.

Further, because the locking portion 32 is locked with the end face 8a of the connector 8, the connector 8 need not be provided with a recess which is concaved from its outer surface. Therefore, various types of the connector 8 can be retained.

In addition, because the operating portion 33 is projected outward from the outer face 22b, operating performance of disengaging the locking portion 32 from the end face 8a of the connector 8 will be enhanced. Because the slanted face 34 is slanted as described above, when the connector 8 is guided to approach to the opening 24, the operating lever 12 will be displaced so that the locking portion 32 may not obstruct an intrusion of the connector 8 into the connector receiving chamber 23. Accordingly, only by bringing the connector 8 close to the opening 24, the connector 8 can be retained, and operating performance of retaining the connector 8 can be also improved.

What is claimed is:

1. An inspecting jig for a wire harness for inspecting electric continuity of terminals in a connector, comprising;
   a jig body having an opening into which said connector is insertable,
   a continuity checking part electrically connectable to terminals of said connector when said connector has entered into said opening,
   a lever member swingably fitted to said jig body, said lever member including a locking portion locking with an end face of said connector when said connector has entered into said opening, thereby to keep said terminals and said continuity checking part in an electrically connected state, after said locking portion has been locked with said end face, and a spring biasing said lever member in a direction in which said locking portion is locked with said end face of said connector.

2. The inspecting jig for the wire harness as claimed in claim 1, wherein said lever member is provided with an operating portion for disengaging the lock between said locking portion and said end face, and said operating portion projects outward from an outer face of said jig body.

3. The inspecting jig for the wire harness as claimed in claim 1, wherein said locking portion projects outward from said opening in a direction of inserting said connector, and includes a slanted face which is opposed to said connector when said connectors is being inserted into said opening and gradually slanted toward an interior of said opening with respect to said inserting direction.

4. An inspecting jig for a wire harness for inspecting electric continuity of terminals in a connector, comprising;

a jig body having an opening into which said connector is adapted to be inserted, a continuity checking part adapted to be electrically connected to terminals of said connector when said connector has entered into said opening, a lever member swingably fitted to said jig body and including a locking portion which is adapted to be locked with an end face of said connector when said connector has entered into said opening, thereby to keep said terminals and said continuity checking part in an electrically connected state, after said locking portion has been locked with said end face, and biasing means for biasing said lever member in a direction in which said locking portion is locked with s aid end face of said connector;

wherein said locking portion projects outward from said opening in a direction of inserting said connector, and includes a slanted face which is opposed to said connector when said connector is being inserted into said opening and gradually slanted toward an interior of said opening with respect to said inserting direction.

5. The inspecting jig for the wire harness as claimed in claim 4, wherein said lever member is provided with an operating portion for disengaging the lock between said locking portion and said end face, and said operating portion projects outward from an outer face of said jig body.

* * * * *